United States Patent [19]

Rialan et al.

[11] 4,449,120

[45] May 15, 1984

[54] METHOD FOR AMPLIFYING MULTIPLEXED SIGNALS THROUGH DIFFERENT GAIN AMPLIFICATION UNITS FOR SELECTING AN OPTIMUM GAIN SIGNAL AND DEVICE THEREFORE

[75] Inventors: Joseph Rialan, Meudon; Jacques Cretin, Le Chesnay, both of France

[73] Assignee: Institut Francais du Petrol, Ruell-Malmaison, France

[21] Appl. No.: 347,680

[22] Filed: Feb. 10, 1982

Related U.S. Application Data

[63] Continuation of Ser. No. 95,124, Nov. 16, 1979.

[30] Foreign Application Priority Data

Nov. 17, 1978 [FR] France .................................. 78 32703

[51] Int. Cl.³ .............................................. H03K 13/02
[52] U.S. Cl. .......................... 340/347 AD; 340/347 M;
340/347 R; 367/67
[58] Field of Search ...................................... 367/65–67;
330/51, 124 R; 340/347 M, 347 AD

[56] References Cited

U.S. PATENT DOCUMENTS

| | | | |
|---|---|---|---|
| 3,449,685 | 6/1969 | Holmes | 330/51 X |
| 3,685,047 | 8/1972 | Sherer et al. | 340/347 AD |
| 3,754,240 | 8/1973 | Milton | 340/347 M X |
| 4,069,479 | 1/1978 | Carpenter et al. | 340/347 AD |
| 4,211,999 | 7/1980 | Clark et al. | 340/347 M X |

OTHER PUBLICATIONS

Blesser, Digitization of Audio: A Comprehensive Examination of Theory . . . , Journal of the Audio Engineering Society, 10/1978, vol. 26, No. 10, pp. 739–749.
The Engineering Staff of Analog Devices, Inc., Analog-Digital Conversion Handbook, 6/1972, p. I–6.

*Primary Examiner*—T. J. Sloyan
*Attorney, Agent, or Firm*—Millen & White

[57] ABSTRACT

A method for amplifying multiplexed signals including the steps of amplifying each signal in different amplifiers, each having different amplification gains, selecting the amplified signal of optimum amplitude and digitizing the selected amplified signal wherein the selection is operated by a previous measuring of the digitized value of the signal, without amplification, considered as a refer signal.

16 Claims, 3 Drawing Figures

FIG.2

METHOD FOR AMPLIFYING MULTIPLEXED SIGNALS THROUGH DIFFERENT GAIN AMPLIFICATION UNITS FOR SELECTING AN OPTIMUM GAIN SIGNAL AND DEVICE THEREFORE

This is a continuation, of application Ser. No. 095,124 filed Nov. 16, 1979.

BACKGROUND OF THE INVENTION

This invention relates to a method for amplifying multiplexed analog signals of large dynamic range, i.e., whose level is liable to large variations, and a device for carrying out said method.

The amplification method is particularly adapted to the amplification of analog signals issued from geophones, arranged on the earth surface, in response to seismic shocks transmitted through a ground layer being surveyed and reflected by the reflecting layers or mirrors of the sub-soil.

According to a known process, the signals issued from each geophone are amplified by a preamplifier and then by a variable gain amplifier made up of a cascade arrangement of amplification units connected in series, each unit having a fixed gain preferably equal to an $n^{th}$ power of 2, n being an integer (binary gain amplification system). A selector member, detecting the average value of the amplitude of the signal issued from the series of amplification units, serially connects an increased number of amplification units to compensate for the progressive decrease of the input signals versus time. The amplified signals are then applied to a chain comprising a multiplexer, an analog-to-digital converter and a digital recorder.

Such a system is described, for example, in the U.S. patent application Ser. No. 99,808.

According to another known process, the seismic signals issued from each geophone or group of geophones are directly supplied to the inputs of an analog multiplexer, after an optional preamplification in a fixed gain preamplifier. The output of the multiplexer, where there are available a sequence of signals, is connected to a single amplifier which is also made up of a chain of amplifying elements arranged in series, the output of each element being connected to the input of the following one. The gain of each amplifying element is fixed and preferably chosen as an $n^{th}$ power of 2, n being an integer.

Since the amplitude from one sample to the next can vary substantially, a selector member selects the number of amplification units through which each signal must pass to reach an optimum level, and connects the output of the amplification unit where this signal is available to the input of an analog-to-digital converter which is connected to a recording system. Such a process is described, for example in the U.S. Pat. No. 3,264,574.

The amplifiers, formed of a series of amplifying units connected in series suffers from certain drawbacks.

As a matter of fact they are relatively slow in view of the cumulative character of the delays affecting the signals when passing through the different amplification units. Similarly the effects of the relatively slow response of each amplification unit, when operated with pulses, characterized by its slew rate, cumulated over all the serially connected elements of the chain, contribute to reduce the overall rapidity of the amplifier response.

There can be also mentioned the overflow of the amplification units which is liable to occur when a sample of low amplitude is followed with another sample of substantially higher value.

A disadvantage inherent in data acquisition chains comprising a head multiplexer further consists in the fact that, for memorizing the sample value during the gain selection step, there must be used a memorization element, currently called sample and hold unit, connected before the amplifier and, consequently, operating on signals of wide amplitude range. As recalled in the following description, a sample and hold unit is technologically more difficult to operate with small signals.

SUMMARY OF THE INVENTION

The method of the present invention avoids the above-mentioned drawbacks.

According to this method, each multiplexed analog signal is subjected to several amplifications of fixed and different gains, thereby producing several amplified signals from which is selected the signal of optimum level by using systematically, as a reference, the digitized value of one signal which after amplification has a predetermined fixed gain.

The amplification is simultaneously performed by several separate amplification elements or units, each having fixed gains different from one unit to another, and connected in parallel, and the selection being performed from the signals issuing from said amplification units of different gains.

The signal of optimum level, which is effectively recorded, is thus amplified in only one amplification unit, instead of the previously used cascade of amplifiers.

Another characteristic of the method is the fact that the selection of the optimum level is obtained by means of a preliminary processing of the digitalized signal issuing from the analog-to-digital converter, which corresponds to the signal issuing from the same amplification element and which is systematically considered as reference element.

The converter, in addition to its main function of digitalizing the optimum signal as recorded, participates to the preliminary operation of selecting said signal. This results in a more simple structure.

BRIEF DESCRIPTION OF THE DRAWINGS

Other features and advantages of the invention will be made apparent from the following description of a particular embodiment, given as example, with reference to the accompanying drawings wherein.

DETAILED DISCUSSION OF THE INVENTION

Figure 1:
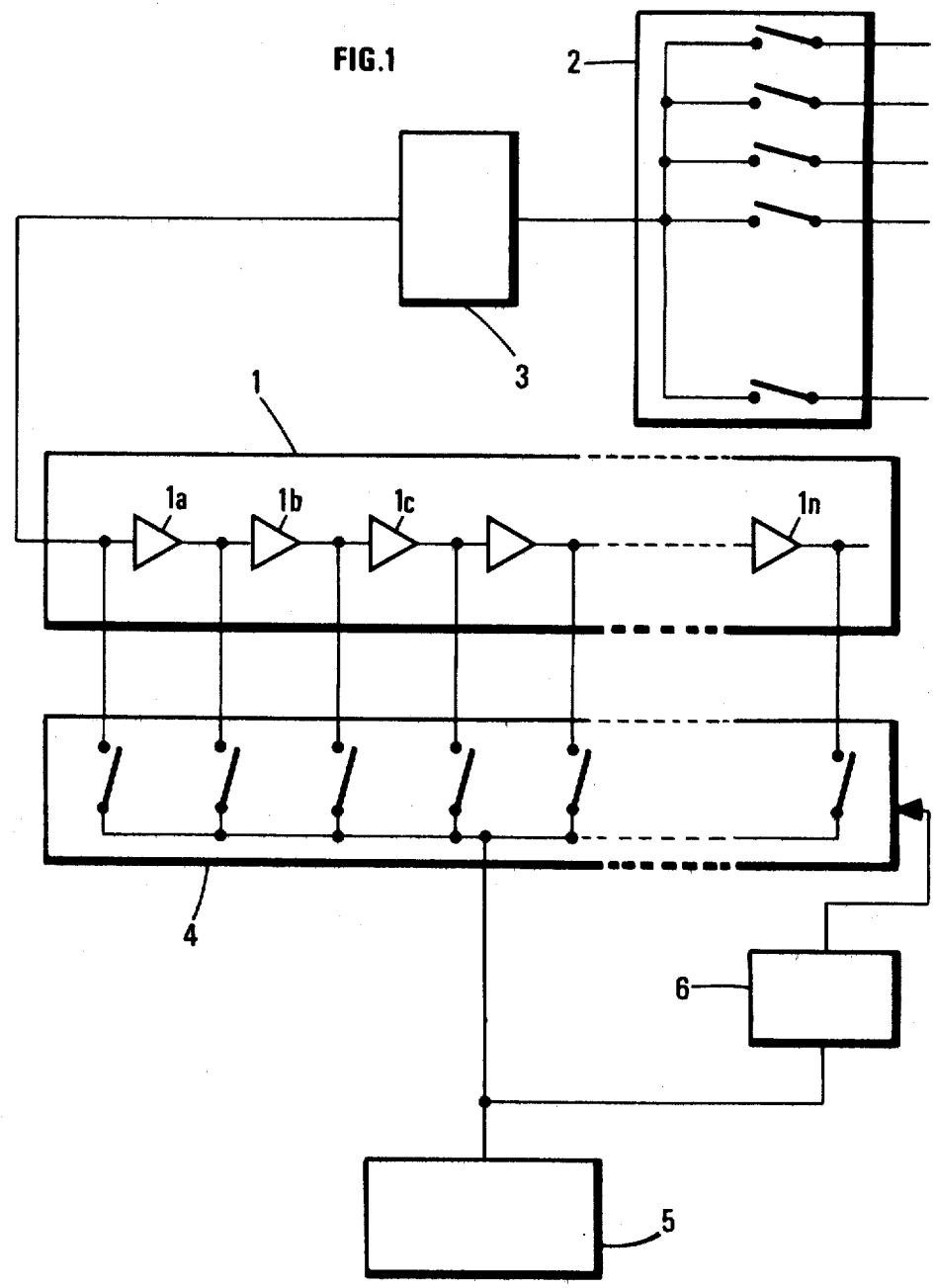
FIG. 1 diagrammatically shows a known structure of an amplifier.

The structure of a known type amplifying device is illustrated in FIG. 1 and comprises an amplifier 1 consisting of a chain of n stages of amplification elements 1a, 1b, 1c . . . 1n, connected in series, the output of one element being connected to the input of the next element. The amplifier is fed with signal samples from a multiplexer 2, through a low level sample and hold unit 3. The output of the successive stages and the input of the first stage are connected to an electronic switch 4. The electronic switch 4 is adapted to switch the signal of optimum level produced at one of the amplification stages and selected by control of the selector 6 onto the input of an analog-to-digital converter 5.

As above-described, it is very difficult to operate a sample and hold unit such as 3 with satisfactory technical performance when it is connected before the amplifier, and is operated at a high sampling rate while being fed with signals encompassing a wide amplitude range. This type of operation results in diaphony effects occurring between a memorized signal sample and the followng one. It must be recalled, as a matter of fact, that an ionization of the dielectric element of the condenser which forms the "memory" of the sample and hold unit occurs in the presence of a sample; the electric discharge of the condenser, at the end of the memorization of a sample, does not completely eliminate said ionization and an interaction with the following signal occurs which is correspondingly higher as the level difference between the two successive memorized signals is greater.

Figure 2:
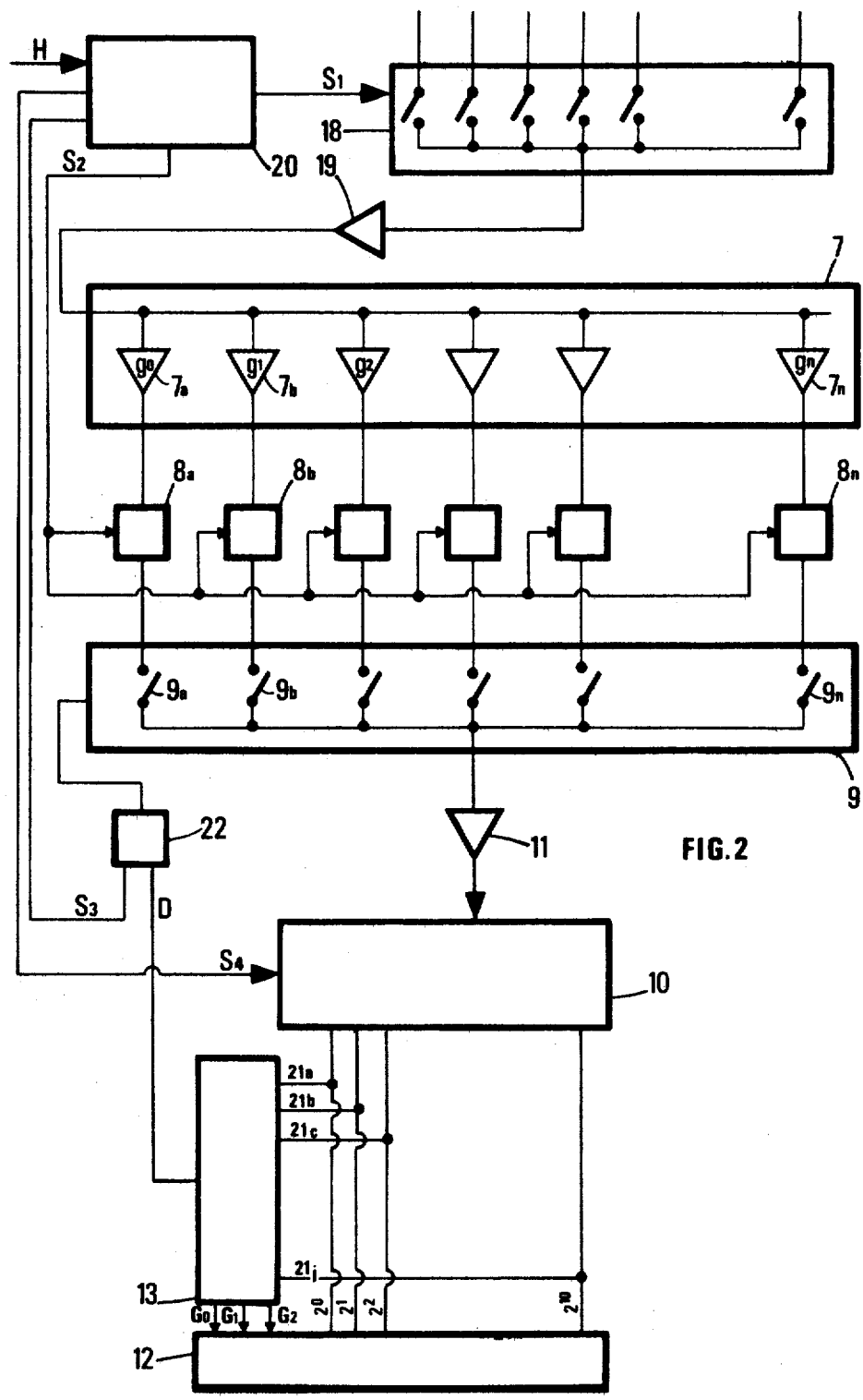
FIG. 2 diagrammatically shows the amplification device according to the invention, FIG. 3 diagrammatically shows the selector member for selecting the signal of optimum level.

The device of the invention comprises (FIG. 2) an amplifier 7 comprising n amplification stages $7a, 7b, \ldots 7n$ whose respective gains $g_0, g_1 \ldots g_n$ are in geometrical progression. Preferably the respective gains $g_0, g_1 \ldots g_n$ of the stages $7a, 7b, \ldots 7n$ are respectively equal to $2^0, 2^1, 2^2 \ldots 2^n$.

By way of example, n may be selected equal to eight. The inputs of all the amplification elements are connected to the output of a multiplexer 18 through a separator stage 19 having a gain of one. The output of the amplification element $7a, 7b \ldots 7n$ are respectively connected to the inputs of n sample and hold units $8a, 8b \ldots 8n$.

By way of non-limitative examples, there can be used sample and hold units such as those manfactured by DATEL or HARRIS under the respective references SHM-IC or A 1-2425-S.

The outputs of the sample and hold units are respectively connected to the inputs of n switches $9a, 9b \ldots 9n$ of a switch member 9 of a known, preferably electronic, type.

All the outputs of member 9 are interconnected to the input of an analog-to-digital converter 10 through a separator stage 11. The converter 10 comprises, in the described embodiment, eleven parallel outputs which carry signals representing the binary coded value of the amplitude of the successive samples, each bearing its sign (binary "words"). The outputs of the converter 10 are connected, on the one side, to the inputs of a digital recorder 12 (with a magnetic tape, for example) and, on the other side, to the inputs of a decoding member 13 which is adapted to generate signals for controlling the switch member 9, through connections $21a, 21b \ldots 21j$.

In accordance with the value of the binary "word" available on the parallel outputs of the converter 10, the decoder 13 generates a signal in the form of a 3-bits word $G_0, G_1, G_2$, which is a gain code signal, adapted to switch on the appropriate switch of the switch member 9. This signal is supplied, on one side to the switch member 9 through the validation gate 22 and, on the other side, to the recorder 12.

The operation of the proceding elements is synchronized by the synchronization element 20 connected to the respective control inputs, to multiplexer 18 through a connection $S_1$, of the sample and hold units $8a, 8b \ldots 8n$ through a connection $S_2$, to the validation gate 22 through a connection $S_3$ and of the analog-to-digital converter 10 through a connection $S_4$. The synchronization element 20 comprises, in a known manner, a shift register whose counting input is connected to a clock unit producing pulses H at a reference frequency, and logic gates for selecting, at each operating cycle of the amplification system, several controlling pulses separated by a time shift.

The selection between the signals amplified at different stages of amplifier 7, and memorized in the corresponding sample and hold units $8a, 8b \ldots 8n$, is performed according to the following operation cycle:

The synchronization element 20 produces a first pulse which is transmitted through $S_1$, $S_2$ and $S_3$ respectively to the multiplexer 18 to close one of its gates and enable the supply of a sample to the amplification elements $7a, 7b \ldots 7n$, to the sample and hold units for controlling the memorization of the signals issued from the amplification elements with the corresponding gains, and to the validation gate 22 to allow the switching on of switch $9a$.

The synchronization element 20 produces a second pulse which is transmitted to the analog-to-digital converter 10 through connection $S_4$ and controls a first digital conversion of the signal issued from amplifier $7a$ of gain one ($g_0$) to a binary "word" and is processed in the decoder 13.

Depending on the signal amplitude, the decoder 13 generates a signal, i.e. a gain code signal, in the form of a 3-bits word for selecting and switching on the appropriate switch so that the signal transmitted to the analog-to-digital converter has the optimum amplitude compatible with the maximum amplitude that the analog-to-digital converter can tolerate. It also transmits the binary value of the selected gain to recorder 12.

The synchronization element 20 generates, on line $S_3$, a third pulse which validates the control signal generated by the decoder 13 and transmitted through connection D to authorize the actuation of the selected switch. The analog-to-digital converter then effects a second digital conversion on the same sample but this time amplified with an appropriate gain.

The result of the second conversion is a binary word representing the binary value of the sample, its sign, and the gain of the amplification stage from which it is issued. This word is transmitted to recorder 12.

It is apparent that with such a structure:

the sampled signal passes only through a single amplifying stage;

the signal converted to a binary word by the converter, during the second digital conversion of each cycle and effectively recorded, has a sufficient amplitude as required for a good operation of the sample and hold unit in which it is memorized. In addition, the amplitude range of the signals memorized in a sample and hold unit and transferred to the converter 10 is low. Accordingly, the diaphony phenomenon which occurs in the known structures where the sample and hold units operate with signals having a wide dynamic range, is low in the present case.

The multiplication of the number of the sample-and-hold units is not a disadvantage. As a matter of fact, the cost of a sample-and-hold unit for a signal at high level is presently relatively low, whereas the cost of such an element adapted to operate efficiently with weak signals is comparatively much higher, since it is very difficult to manufacture.

Figure 3:
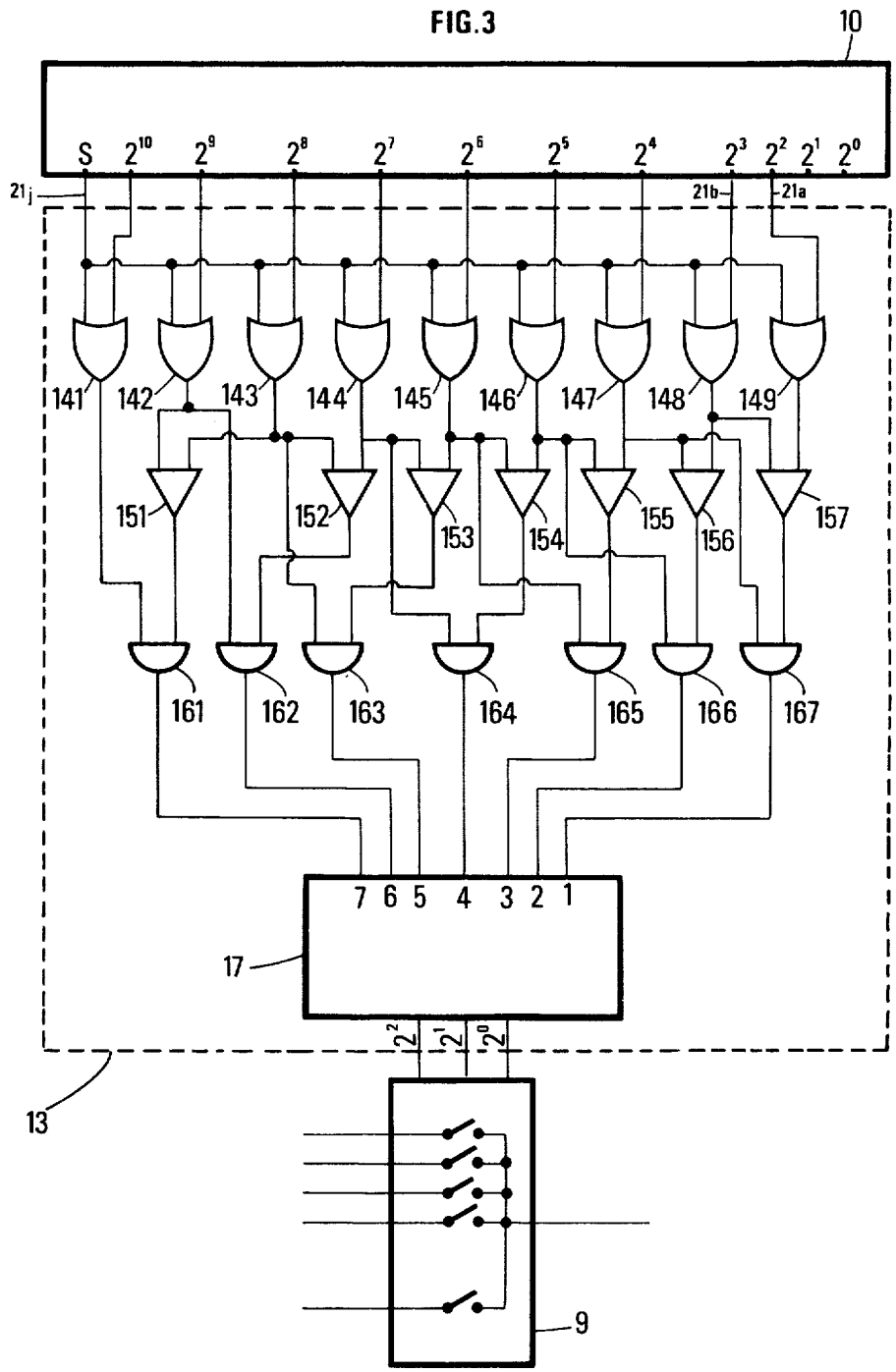

The decoder 13 comprises, by way of example, (FIG. 3) 9 gates of the "exclusive OR" type 141, 142 . . . 149 with two inputs. The output S of the analog-to-digital converter designed for the binary digit of the sign is connected to a first input of each gate 141 to 149. The outputs of binary ranks or weights 2 to 10 of the converter, where there are respectively available, the bits corresponding to powers $2^2$ to $2^{10}$ of the binary notation, are connected to the second input of the OR gates 141 to 149 respectively.

Gates of the AND type with two inputs 151, 152, 153 . . . 157 have their respective inputs connected to the outputs of OR gates (142 and 143), (143 and 144), (144 and 145), (145 and 146), (146 and 147), (147 and 148), (148 and 149). The outputs of gates 141 and 151 are connected to the inputs of an OR gate with two inputs 161. Similarly, the outputs of gates (142 and 152), (143 and 153), (144 and 154), (145 and 155), (146 and 156) and (147 and 157) are respectively connected to the inputs of OR gates 162, 163, 164, 165, 166 and 167 of the same type as the OR gate 161. The outputs of the OR gates 161, 162 . . . 167 are connected to a "priority encoder" 17 made up by an integrated circuit, for example of the 74148 type and comprising three binary outputs of binary ranks or weights 0, 1 and 2. The outputs of ranks 0 and 1 are not connected, so that the priority encoder 17 takes only into account the digitalized signals for which the outputs of weight greater or equal to two of the converters are actuated.

With such structure, when either the output of weight 10 of the converter is actuated, or both the outputs of weights or binary ranks, 9 and 8, are actuated, the input No. 7 of the priority encoder is also be actuated; when either the gate of weight of binary rank 9 of the converter is actuated, or both the outputs of weights or binary ranks 8 and 7 are actuated, then the input No. 6 of the encoder is actuated etc. . . The encoder gives the priority among all its actuated inputs to the one having the highest rank and indicates the selected input in binary code with three bits on its outputs.

This binary word of 3 bits controls the actuation of one of the eight switches 9a, 9b . . . 9h of the switch member 9.

When input No. 7 of the encoder is actuated, this means that the amplitude of the signal issued from amplifier 7a is optimum and compatible with the level required by the converter 10, and the three bits binary word generated by the encoder 17 will maintain the switch member in its initial state (switch 9a on) for the second digital conversion. However when input No. 7 is not actuated, this means that the amplitude of the signal issued from 7a is lower than the optimum level and that it is necessary to apply a certain amplification gain to the signal. For this purpose the encoder 13 controls, through the three bits binary word, the switch associated to the amplifier whose gain gives, at the input of converter 10 a signal of optimum amplitude, said gain being the higher as the rank of the actuated input of the encoder, which corresponds to the amplitude level of the signal transmitted without amplification (amplification ratio of 1), is smaller. Thus, the gain selection provides for an automatic compensation of the insufficient amplitude levels or some signals.

The gates of exclusive OR type 141 to 149 make the output numeral indicated by the priority encoder 17 independent from the sign of the sample amplitude since the gates of "exclusive OR" type which are also controlled by the bit defining the sign permit the binary signals to be inverted at the outputs of the analog-to-digital converter 10 when the figures coded by the latter are in the form "of powers of two".

What is claimed is:

1. In a method for amplifying multiplexed analog signals having amplitudes subject to large variations, such that the gain amplification of the signals is optimized for subsequent digitization in an analog-to-digital converter and recording thereof, the method comprising simultaneously and separately amplifying each analog signal received, in parallel connected amplifying means, to different specified gain levels for obtaining a plurality of amplified analog signals corresponding to predetermined amplification gains, each predetermined gain being different from the others, selecting the optimum gain amplified analog signal, and transmitting said optimum gain signal by switching means to the analog-to-digital converter for digitization therein and subsequent storage, the improvement comprising performing the selecting by means of the following sequential steps:

(a) controlling the switching means to transmit one of the amplified analog signals from a predetermined one of said parallel connected amplifying means to the analog-to-digital converter for digitizing therein;

(b) generating a specific gain code signal from said digitized amplified analog signal transmitted from said predetermined one of said amplifying means; and (c) controlling the switching means by supplying said specific gain code signal thereto and thereby causing said switching means to transmit the optimum gain amplified analog signal from the corresponding one of said plural amplifying means, whereby the optimum level amplified analog signal for the analog-to-digital converter is obtained in a rapid manner.

2. In a method for amplifying multiplexed analog signals having amplitudes subject to large variations, such that the gain amplification of the signals is optimized for subsequent digitization in an analog-to-digital converter and recording thereof, the method comprising simultaneously and separately amplifying each analog signal received, in parallel connected amplifying means, to different specified gain levels for obtaining a plurality of amplified analog signals corresponding to predetermined amplification gains, each predetermined gain being different from the others, selecting the optimum gain amplified analog signal, and transmitting said optimum gain signal by switching means to the analog-to-digital converter for digitization therein and subsequent storage, the improvement comprising performing the selecting by means of the following sequential steps:

(a) temporarily storing each one of said amplified analog signals from each one of said parallel connected amplifying means;

(b) controlling the switching means to transmit a predetermined one of the stored amplified analog signals to the analog-to-digital converter for digitizing therein;

(c) generating a specified gain code signal from said digitized predetermined amplified analog signal; and (d) controlling the switching means by supplying said specific gain code signal thereto and thereby causing said switching means to transmit the optimum gain temporarily stored amplified analog signal to the analog-to-digital converter, whereby the optimum level amplified analog signal for the analog-to-digital converter is obtained in a rapid manner.

3. In an amplification device for amplifying analog signals subject to great amplitude variations, to an optimum level of amplification prior to digitization in an analog-to-digital converter and recording thereof, said analog signals being transmitted by multiplexing means to a plurality of amplifying elements, the amplifying elements having parallel connected inputs and each having a predetermined fixed gain different from the gains of the others of said plurality of amplifying elements, the respective outputs of the amplifying elements being connected to respective switching means, wherein the improvement comprises:

synchronizer control means for causing said switching means to transmit a predetermined one of said amplified analog signals to the input of the analog-to-digital converter for digitization therein; and selecting unit means connected to the output of the analog-to-digital converter for receiving said digitized predetermined amplified analog signal and for generating a specific gain code signal therefrom, and connected to said switching means for transmitting said generated gain code signal thereto whereby said gain code signal transmitted causes the switching means associated with the optimum level amplifying means to close and thereby transmit the optimum level amplified analog signal to be transmitted to said analog-to-digital converter for digitization and recording thereof in a rapid manner.

4. An amplification device as in claim 3, wherein said selecting unit means comprises a first assembly of a logic gates connected to the outputs of the analog-to-digital converter, and a second assembly of logic gates connected to a detecting means for detecting the highest binary rank output transmitted from the analog-to-digital converter and for generating said specific gain code signal for the control of the switching means and the selection of the analog amplified signal of optimum gain level.

5. In an amplification device for amplifying analog signals subject to great amplitude variations, to an optimum level of amplification prior to digitization in an analog-to-digital converter and recording thereof, said analog signals being transmitted by multiplexing means to a plurality of amplifying elements, the amplifying elements having parallel connected inputs and each having a predetermined fixed gain different from the gains of the others of said plurality of amplifying elements, the respective outputs of the amplifying elements being connected to respective switching means, wherein the improvement comprises:

synchronizer control means for causing said switching means to transmit a predetermined one of said amplified analog signals to the input of the analog-to-digital converter for digitization therein;

a plurality of memory means, each respectively connected to the outputs of each of said plurality of amplifying elements for intermittently storing the amplified signals from said amplifying elements during digitization of said initially transmitted predetermined one of said amplified analog signals, and for subsequently transmitting the optimum level amplified analog signal through said switching means to the analog-to-digital converter; and selecting unit means connected to the output of the analog-to-digital converter for receiving said digitized predetermined amplified analog signal and for generating a specific gain code signal therefrom, and connected to said switching means for transmitting said generated gain code signal thereto whereby said gain code signal transmitted causes the switching means associated with the memory means having the optimum level amplified analog signal stored therein to close and thereby transmit the optimum level amplified analog signal to be transmitted to said analog-to-digital converter for digitization and recording thereof in a rapid manner.

6. An amplification device as in claim 5, wherein said selecting unit means comprises a first assembly of logic gates connected to the outputs of the analog-to-digital converter and a second assembly of logic gates connected to a detecting means for detecting the highest binary rank output transmitted from the analog-to-digital converter and thereby generating said specific gain code signal for the control of the switching means and the selection of the amplified analog signal of optimum gain.

7. An amplication device as in claim 3 or 5, wherein the first amplifying element of said plurality of amplifying elements has a gain of 1, and said predetermined analog signal for the initial digitization being the signal issuing from said first amplifying element.

8. An amplification device according to claim 3 or 5, wherein the gain levels of the amplifying elements are selected to be equal to different powers of 2.

9. An amplification device according to claim 6 or 4, wherein said detecting means for detecting, from all said actuated outputs of the analog-to-digital converter, the highest binary rank output, is adapted for generating a specific gain code signal whereby the amplifying element selected has a higher gain when the binary rank is lower.

10. An amplification according to claim 5, wherein said selecting means is adapted for generating the specific gain code signal for controlling said switching means for switching on an amplification element of said plurality having a gain which is higher when the binary rank of the signal initially digitized in the converter is lower.

11. An amplification device according to claim 3 or 5, wherein said switching means are electronic switches.

12. An amplification device according to claim 3 or 5 further comprising a recorder connected to the output of the analog-to-digital converter.

13. An amplification device according to claim 3, wherein said selecting unit means comprises a decoder adapted for generating signals for controlling the operation of the switching means.

14. An amplification device according to claim 5, wherein said selecting unit means comprises a decoder adapted for generating signals for controlling the operation of the switching means.

15. An amplification device according to claim 14, wherein the synchronizer control means is connected to the plurality of memory means for controlling the storing of signals from the amplifying elements, to the decoder for causing said decoder to switch on a predetermined one of the switching means to transmit the predetermined one of said analog signals to the input of the analog-to-digital converter, and to the analog-to-digital converter to cause said analog-to-digital converter to effect a digital conversion of said predetermined analog signal and transmit the converted signal to the decoder for generation of the specific gain code signal and causing the corresponding switching means to transmit the optimum level analog signal to the analog-to-digital converter.

16. An amplification device according to claim 13 or 14, wherein said decoder comprises a first plurality of parallel connected OR gates, with their outputs respectively connected to one of the inputs of a corresponding one of a plurality of parallel connected AND gates, and to one of the inputs of a corresponding one of a second plurality of OR gates, and wherein the outputs of the second plurality of OR gates are connected to a priority encoder for prioritizing the inputs therefrom, and thereby controlling said switching means in accordance with the input having maximum priority.

* * * * *